(12) United States Patent
Moon

(10) Patent No.: US 7,111,080 B2
(45) Date of Patent: Sep. 19, 2006

(54) DISTRIBUTING AN ELECTRONIC SIGNAL IN A STACKABLE DEVICE

(75) Inventor: Bruce Moon, Dublin, CA (US)

(73) Assignee: Cisco Technology, Inc., San Jose, CA (US)

( * ) Notice: Subject to any disclaimer, the term of this patent is extended or adjusted under 35 U.S.C. 154(b) by 180 days.

(21) Appl. No.: 10/791,464

(22) Filed: Mar. 1, 2004

(65) Prior Publication Data

US 2005/0193151 A1 Sep. 1, 2005

(51) Int. Cl.
*G06F 3/00* (2006.01)

(52) U.S. Cl. .................. 710/2; 710/300; 211/134; 211/153

(58) Field of Classification Search ............ None
See application file for complete search history.

(56) References Cited

U.S. PATENT DOCUMENTS

| | | |
|---|---|---|
| 4,538,210 A | 8/1985 | Schaller |
| 4,558,914 A | 12/1985 | Prager et al. |
| 4,761,681 A | 8/1988 | Reid |
| 4,807,021 A | 2/1989 | Okumura |
| 4,984,358 A | 1/1991 | Nelson |
| 4,996,587 A | 2/1991 | Hinrichsmeyer et al. |
| 5,052,953 A | 10/1991 | Weber |
| 5,138,434 A | 8/1992 | Wood et al. |
| 5,229,647 A | 7/1993 | Gnadinger |
| 5,266,912 A | 11/1993 | Kledzik |
| 5,790,782 A * | 8/1998 | Martinez et al. .......... 714/53 |
| 6,038,130 A | 3/2000 | Boeck et al. |
| 6,092,214 A | 7/2000 | Quoc et al. |
| 6,235,554 B1 | 5/2001 | Akram et al. |
| 6,271,056 B1 | 8/2001 | Farnworth et al. |
| 6,614,104 B1 | 9/2003 | Farnworth et al. |
| 6,726,509 B1 * | 4/2004 | Milan ................ 439/752.5 |
| 6,728,113 B1 | 4/2004 | Knight et al. |
| 6,793,539 B1 | 9/2004 | Lee et al. |
| 6,843,684 B1 * | 1/2005 | Milan ........................ 439/606 |
| 6,850,408 B1 * | 2/2005 | Coglitore et al. .......... 361/683 |
| 6,889,345 B1 * | 5/2005 | Sicola et al. ................ 714/43 |
| 6,912,599 B1 * | 6/2005 | Sicola et al. ................. 710/8 |
| 6,920,511 B1 * | 7/2005 | Sicola et al. .............. 710/100 |
| 6,955,945 B1 * | 10/2005 | Rapport et al. ........... 438/107 |

(Continued)

OTHER PUBLICATIONS

International Searching Authority, "Notification of Transmittal of the International Search Report and the Written Opinion of the International Searching Authority, or the Declaration," PCT/US05/04214, dated Jun. 22, 2005, 9 pages.

(Continued)

*Primary Examiner*—Fritz Fleming
*Assistant Examiner*—Niketa Patel
(74) *Attorney, Agent, or Firm*—Hickman Palermo Truong & Becker LLP

(57) ABSTRACT

Techniques are provided for distributing signals in a stackable unit, including a first input connector of two or more input connectors; a second input connector of two or more input connectors, wherein the first input connector is spaced apart from the second input connector, and the first input connector has a particular spatial relationship to the second input connector; a first output connector of two or more output connectors; a second output connector of two or more output connectors, wherein the first output connector is spaced apart from the second output connector, and the first output connector has the same particular spatial relationship to the second output connector; means for communicatively coupling the first input connector and the second output connector; and means for terminating the first output connector.

21 Claims, 8 Drawing Sheets

U.S. PATENT DOCUMENTS

2002/0063621 A1    5/2002    Tseng et al.
2003/0114049 A1    6/2003    Milan
2003/0199203 A1    10/2003   Milan

OTHER PUBLICATIONS

Current Claims, PCT/US05/04214, 5 pages.

Cisco Systems, Inc., "Catalyst 3900 Stackable Token Ring Switch," 1997, 5 pages.

Cisco Systems, Inc., "Catalyst 3508G XL Stackable Gigabit Ethernet Switch," 2001, pp. 1-6.

Cisco Systems, Inc., "Catalyst 3524-PWR XL Stackable 10/100 Ethernet Switch," 2001, pp. 1-7.

* cited by examiner

DISTRIBUTING AN ELECTRONIC SIGNAL IN A STACKABLE DEVICE

FIELD OF THE INVENTION

The present invention generally relates to the transmission of electronic signals. The invention relates more specifically to distributing an electronic signal in a stackable device.

BACKGROUND OF THE INVENTION

The approaches described in this section may be pursued, but are not necessarily approaches that have been previously conceived or pursued. Therefore, unless otherwise indicated herein, the approaches described in this section are not prior art to the claims in this application and are not admitted to be prior art by inclusion in this section.

One approach to distributing an electronic signal in a stackable device is to connect external wires to the each of the stackable devices. A problem with this approach is that the external wires are cumbersome and, in some cases, can lead to hazardous conditions; for example, the wires may present a tripping hazard. Another problem with the use of external wires is that their configuration requires expertise and is prone to error. For example, in many instances, only a limited number of certain devices can be connected together. If more than a preset number of devices are connected together, then the system will not function properly. For example, consider a computer that has limited capability to address memory on hard disk. If a human operator connects too many disk drives together and, thereby, more drive space than is addressable is added, the system will not function as intended. Alternatively, in some systems only a limited number of output devices can be driven by a particular signal output.

A second approach to distributing an electronic signal in a stackable device is to use a bus or a daisy chain. Either a bus or a daisy chain can involve wires that are internal to an encompassing case, but each still requires wires that are external to the stackable devices For example, a bus implemented as a ribbon cable connecting multiple disk drives is external to the disk drives, but internal to a computer case. Since the wires are external to the stackable devices, the approach still suffers the problems of cumbersome wires and expertise being needed to properly connect multiple devices to the bus or daisy chain.

Both of these approaches also suffer in that neither has a manner to simplify configuration, and specifically to simplify the limitation of devices that can be interconnected.

Therefore, given the discussion above, it is clearly desirable to have techniques that overcome the limitations discussed herein.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENT

Figure 1:
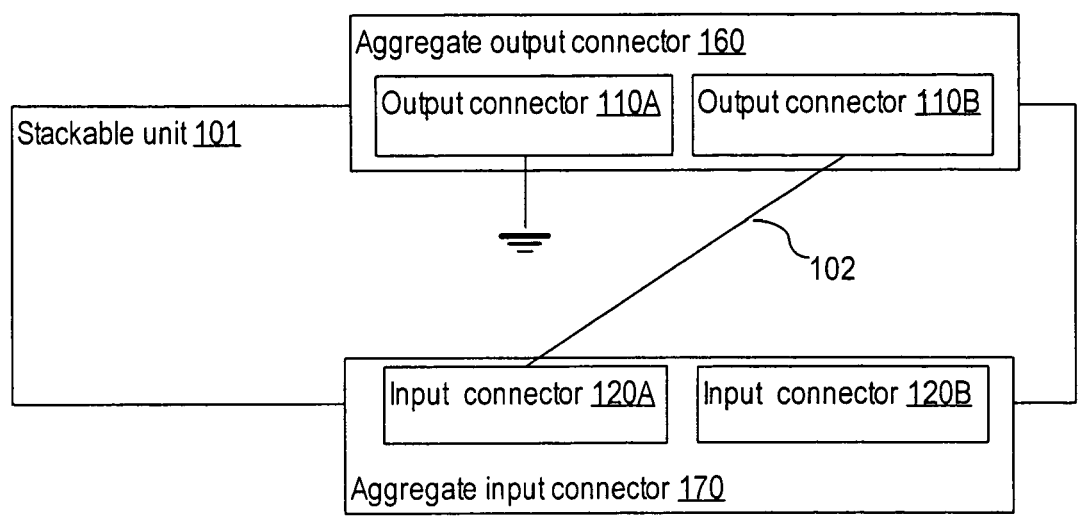
FIG. 1 depicts a stackable unit configured to take two input signals.

Techniques for distributing an electronic signal in a stackable device are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Embodiments are described herein according to the following outline:
 1.0 General Overview
 2.0 Structural Overview
  2.1 Approaches for Distributing Signals in a Stackable Device
  2.2 Example Embodiments
 3.0 Functional Overview
 4.0 Extensions and Alternatives 1.0 General Overview The needs identified in the foregoing Background, and other needs and objects that will become apparent for the following description, are achieved in the present invention, which includes, in one aspect, an apparatus for distributing a signal in a stackable unit, including a first input connector of two or more input connectors; a second input connector of two or more input connectors, wherein the first input connector is spaced apart from the second input connector, and the first input connector has a particular spatial relationship to the second input connector; a first output connector of two or more output connectors; a second output connector of two or more output connectors, wherein the first output connector is spaced apart from the second output connector, and the first output connector has the same particular spatial relationship to the second output connector; means for communicatively coupling the first input connector and the second output connector; and a means for terminating the first output connector.

In a related feature, the stackable unit is a stackable hub, wherein the two or more output connectors and the two or more input connectors are USB connectors, and wherein each of the two or more output connectors is disposed in a foot of the stackable hub and each of the two or more input connectors is disposed in a top portion of the stackable hub in a position substantially above a particular input connector of the two or more input connectors. In a related feature, the stackable unit is a stackable expansion module for network attached storage; the two or more output connectors and the two or more input connectors are USB connectors; and each of the two or more output connectors is disposed in a foot of the stackable expansion module and each of the two or more input connectors is disposed in a top portion of the stackable expansion module in a position substantially above a particular input connector of the two or more input connectors.

In a related feature, the two or more output connectors include three or more output connectors; and the apparatus further includes a means for terminating a third output connector of the three or more output connectors, wherein the third output connector is spaced apart from both the first output connector and the second output connector.

In a related feature, an aggregate input connector includes the two or more input connectors; and an aggregate output connector includes the two or more output connectors. In a related feature, the two or more input connectors are provided as two or more separate connectors and the two or more output connectors are provided as two or more separate connectors. In a related feature, at least one of the two or more input connectors is located at one extreme of the apparatus and at least one of the two or more output connectors is located at a corresponding extreme on an opposite portion of the apparatus.

In a related feature, the stackable unit is a stackable audio component, each of the two or more input connectors is capable of transmitting an audio signal. In a related feature, the stackable unit is a stackable video component, each of the two or more input connectors is capable of transmitting a video signal. In a related feature, each connector of the two or more input connectors and each connector of the two or more output connectors is capable of transmitting power and the second output connector is terminated by providing no power over the connector. In a related feature, the stackable unit is a stackable recording device and each connector of the two or more input connectors and each connector of the two or more output connectors is capable of transmitting a recordable signal and the means for terminating the second output connector includes a means for transmitting a signal that indicates that the recordable signal is not being transmitted over the second output connector.

In a related feature, the second input connector of the two or more input connectors carries a particular signal, wherein the particular signal is a terminating signal and the apparatus further includes a means for detecting the terminating signal. In a related feature, each connector of the two or more input connectors and each connector of the two or more output connectors is capable of transmitting two or more signals. In a related feature, the stackable unit is a microchip and wherein each connector of the two or more input connectors and each connector of the two or more output connectors includes one or more pins on the microchip. In a related feature, each connector of the two or more input connectors and each connector of the two or more output connectors is capable of transmitting a clock signal; and the means for terminating the second output connector includes sending a signal other than the clock signal over the second output connector.

In another aspect, an apparatus is provided for distributing a signal in a stackable device including a means for providing a first output signal to a first stackable unit through a first output connector of two or more output connectors; a means for providing a second output signal to the first stackable unit through a second output connector of two or more output connectors, wherein the first output connector is spaced apart from the second output connector; and a means for determining which signal is provided to a particular unit by determining through which connector a particular signal is being provided.

In another aspect techniques are provided for distributing a signal in a stackable unit, the method including the steps of providing a first input connector of two or more input connectors; providing a second input connector of two or more input connectors, wherein the first input connector is spaced apart from the second input connector, and the first input connector has a particular spatial relationship to the second input connector; providing a first output connector of two or more output connectors; providing a second output connector of two or more output connectors, wherein the first output connector is spaced apart from the second output connector, and the first output connector has the same particular spatial relationship to the second output connector; communicatively coupling the first input connector and the second output connector; and terminating the first output connector.

In another aspect techniques are provided for distributing a signal in a stackable unit, the method including the steps of providing a first output signal to a first stackable unit through a first output connector of two or more output connectors; providing a second output signal to the first stackable unit through a second output connector of two or more output connectors, wherein the first output connector is spaced apart from the second output connector; and determining which signal is provided to a particular unit by determining through which connector a particular signal is being provided.

2.0 Structural Overview 2.1 Approaches For Distributing Signals In a Stackable Device FIG. 1 depicts a stackable unit 101 configured to take two input signals. The stackable unit 101 comprises an aggregate input connector 170 and an aggregate output connector 160. Two or more stackable units 101 may be vertically stacked such that aggregate output connector 160 of a first stackable unit mates to an aggregate input connector 170 of a second stackable unit. Any number of stackable units 101 up to a specified maximum number of units may be so stacked with respective connectors mated.

In one embodiment, the aggregate input connector 170 comprises input connectors 120A, B. In another embodiment, the aggregate input connector 170 is a logical grouping of the input connectors 120A, B, and input connectors 120A, B are physically separate connectors. Alternatively, the aggregate input connector 170 is a single physical connector that comprises input connectors 120A, B. In various embodiments, aggregate input connector 170 comprises two or more input connectors 120A, B.

In one embodiment, the aggregate output connector 160 comprises output connectors 110A, B. In another embodiment, the aggregate output connector 160 is a logical grouping of the output connectors 110A, B, and output connectors 110A, B are physically separate connectors. Alternatively, the aggregate output connector 160 is a single physical connector and comprises output connectors 110A, B. In various embodiments, aggregate output connector 160 comprises two or more output connectors 110A, B.

Figure 5:
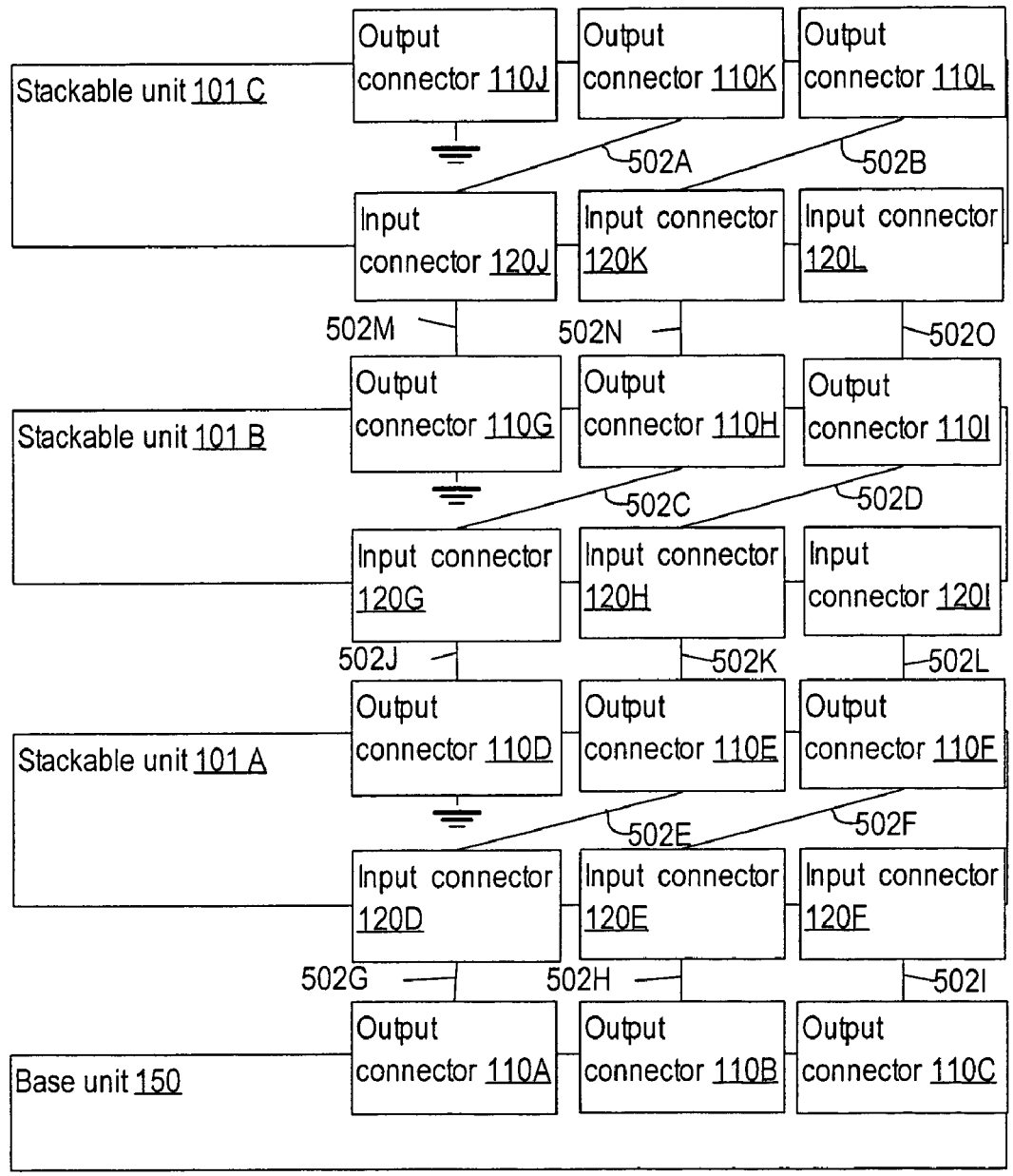
FIG. 5 depicts a single base unit communicatively coupled to three stackable units.

Input connectors 120A, B are physical connectors that receive signals from the output connectors of other stackable units 101 or base unit 150 (e.g., see FIG. 5). In various embodiments, each input connector 120A, B comprises conductive metal mechanisms to receive signals, provides optical, infrared, or radio receivers to receive signals, or any other appropriate means for receiving signals. In various embodiments, input connectors 120A, B each receives one or more signals. In various embodiments, input connectors 120A, B are each a single connector receiving one or more signals or are each two or more physically separate connectors with each separate physical connector each receiving one or more signals.

Output connectors 110A, B are physical connectors which provide signals to the input connectors 120A, 120B of other stackable units 101 when arranged in a vertical stack with the connectors mated (e.g., see FIG. 5). In various embodiments, each output connector 110A, B comprises conductive metal mechanisms to transmit signals, provides optical, infrared, or radio transmitters to transmit signals, or any other appropriate means for transmitting signals. In various embodiments, output connectors 110A, B each transmit one or more signals. In various embodiments, output connector 110A, B are each single connectors each providing one or more signals or are each two or more physically separate connectors with each separate physical connector each providing one or more signals.

In various embodiments, the signals traveling over each of the input connectors 120A, B and output connectors 110A, B are the same signal, are the same type of signal, are different signals, or are different types of signals. For simplicity in description, example embodiments discussed herein will comprise multiple connectors which each provide the same (one or more) types of signals over each connector. Other embodiments of the techniques described herein are possible and the choice of example embodiments in no way limits the techniques described herein.

Input connector 120A is communicatively coupled to output connector 110B by a link 102. In various embodiments, these, and other communicatively coupled items, are linked by any appropriate means including conductive metal; optical, infrared, or radio signal senders, receivers and communication; or any other appropriate communication mechanism. As such, the one or more signals provided to input connector 120A are each provided to output connector 110B.

In one embodiment, the link 102 communicatively couples connectors that are not vertically aligned. For example, a link 102 may connect an input connector 120A on the bottom, front, left of an apparatus to the top, front, right output connector 110B of an apparatus. In an arrangement where there are multiple input connectors and output connectors, it may be useful to link connectors that are not vertically aligned in order to physically limit the number of devices that can be effectively stacked on a base unit. In various embodiments, the input connectors are communicatively coupled by links to output connectors that are not vertically aligned with them and the links connect them in a counter clockwise, clockwise, or any appropriate pattern. In such embodiments, there are also one or more input signals that are consumed by the device and one or more of the output connectors has no signal or a terminating signal transmitted through it. The effect of these patterns of connections, the consumption of one or more of the input signals, and the transmission of no signal or terminating signals over one or more of the output connectors is that the number of devices that can receive valid signals is limited to, at most, the number of connectors.

In one embodiment, the signal provided to output connector 110A is "terminated". In a related embodiment, output connector 110A is grounded and the grounding is accomplished in any appropriate manner. In various embodiments, terminating a signal comprises providing no signal or a particular signal or signals on output connector 110A to signify that it is not transmitting a signal from an input connector. The particular signal or signals might be called a "dial tone" signal.

In one embodiment, the signal from the input connector 120B is not transmitted to any output connectors 110A or 110B. In one embodiment, the signal incoming on input connector 120B is consumed by the stackable unit 101. For example, if the signal incoming on input connector 120B was power, then the stackable unit 101 may consume the signal for use in powering the stackable unit 101.

As an example of an embodiment of FIG. 1, consider stackable stereo equipment. Each input connector 120A, B receives two signals, one for digital audio input and one for power. A stackable unit 101, say for example a tape recorder uses the power signal from input connector 120B to power itself and uses the audio input signal from input connector 120B to provide input audio to the tape recorder. The stackable unit 101 also transmits the signals incoming on input connector 120A to the output connector 110B and provides no signals, e.g. no audio and no power, to output connector 110A. Either the aggregate input connector 170 and aggregate output connector 160 may be single connectors comprising the input connectors 120A, B and output connectors 110A, B, respectively, or the input connectors 120A, B and output connectors 110A, B may each be physically separate physical connectors.

Figure 2A:
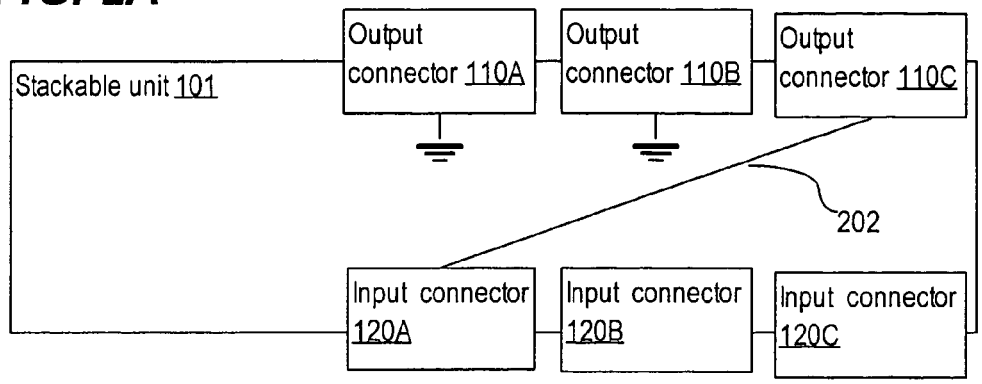
FIG. 2A is a logical view of a stackable unit.
Figure 2B:
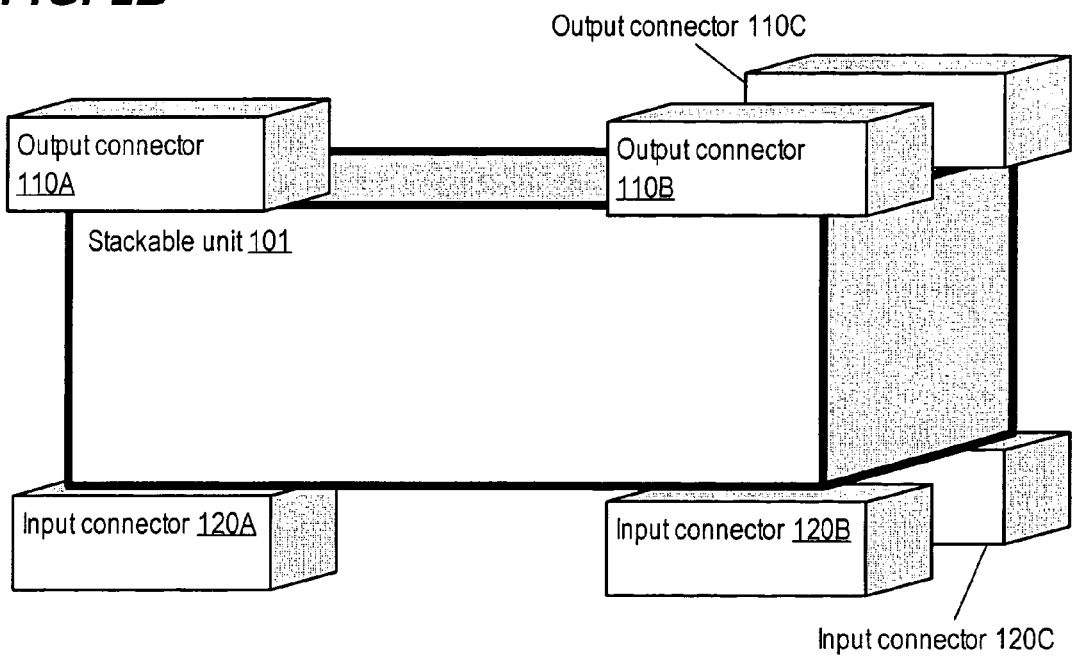
FIG. 2B is a rendering of an embodiment of the physical shape of a stackable unit.

FIG. 2A and FIG. 2B depict two views of a stackable unit 101. FIG. 2A is a logical view of the stackable unit 101. FIG. 2B is a rendering of an embodiment of the physical shape of the stackable unit 101. The stackable unit 101 of FIG. 2A and FIG. 2B is similar in many respects to the stackable unit 101 described above in FIG. 1. In FIG. 2A and FIG. 2B, however, unit 101 includes three input connectors 120A, B, C and three output connectors 110A, B, C. The input connectors 120A, B, C and three output connectors 110A, B, C have the structure and function described above with respect to connectors of FIG. 1.

In one embodiment, input connector 120A is communicatively coupled to output connector 110C by link 202. Link 202 has the structure described above for link 102 of FIG. 1. In various embodiments, the output connector 110A, B are provided no signal or are provided a signal or signals that indicate that no signal is being transmitted from an input connector 120. In one embodiment, the signals received on input connectors 120B, C are not transmitted to any output connector 110A, B, C. In another embodiment, the signals from input connector 120B, C are consumed by the stackable unit 101.

As an example of an embodiment of FIG. 2A, consider stackable network hubs. Each input connector 120A, B receives two signals: one network signal and one signal for power. The stackable unit 101, a network hub, uses the power signals from input connectors 120B, C to power itself and uses the network input signal on input connectors 120B, C to provide network connections to devices communicatively coupled to the stackable hub 101. The stackable hub 101 also transmits the signals incoming on input connector 120A to the output connector 110C. It provides no signals, e.g. no network signal and no power, to output connectors 110A, B. By providing signals only over output connector 110C and no signal to output connectors 110A, B, the number of devices that can be effectively stacked on this device is limited to one. Moreover, any additional stackable unit 101 beyond the first unit 101 that is stacked directly or indirectly upon this unit 101 will receive no signal.

In the embodiment depicted in FIG. 2B, the output connectors 110A, B, C are physically located on the top of the stackable unit 101 and the input connectors 120A, B, C are located on the bottom of the stackable unit 101. In various embodiments, the output connectors 110A, B, C and input connectors 120A, B, C are located on the bottom, top, sides, front, or back of the stackable unit. The location of the input connectors 120A, B, C and output connectors 110A, B, C in no way limits the scope of the techniques described herein.

Further consider the example above given for FIG. 2A with respect to FIG. 2B. The output connectors 110A, B, C and input connectors 120A, B, C may be USB connectors, for example. USB connectors can transmit numerous signals, including network, data signals, and power. In such a case, input connectors 120A, B, C are mounted in the feet of the stackable unit 101 and output connectors 110A, B, C are mounted in corresponding locations on the top of the stackable unit 101. For example, mounting the output connectors 110A, B, C and input connectors 120A, B, C in such a manner is appropriate for signal transmittal in certain stackable devices with the form factor of FIG. 6.

Figure 3:
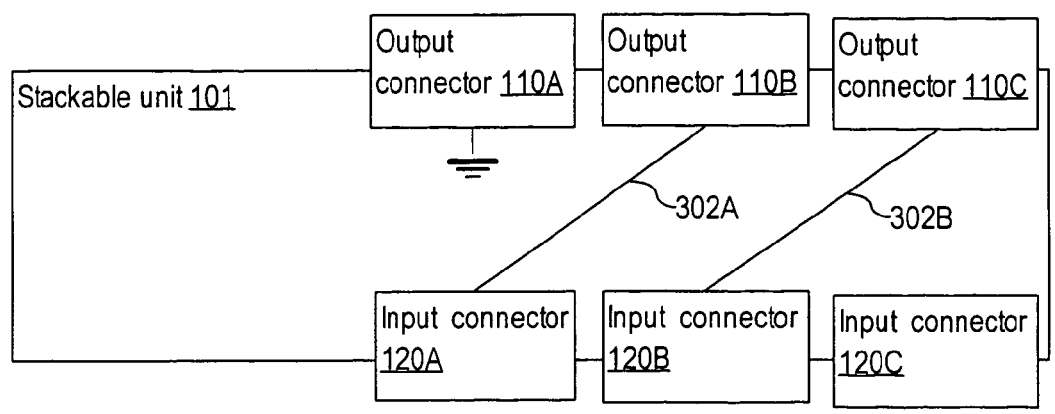
FIG. 3 depicts a stackable unit with three input connectors and three output connectors.

FIG. 3 depicts a stackable unit 101 with three input connectors 120A, B, C and three output connectors 110A, B, C. Embodiments of input connectors 120A, B, C and output connectors 110A, B, C are described above.

In the embodiment of FIG. 3, input connector 120A is communicatively coupled to output connector 110B by link 302A and input connector 120B is communicatively coupled to output connector 110C by link 302B. Links 302A, 302B have structures that are described above for link 102. In various embodiments, the one or more signals received at input connector 120A are transmitted from output connector 110B or the one or more signals received at input connector 120B are transmitted from output connector 110C. In various embodiments, the output connector 110A is terminated by providing no signal or providing a signal or signals that indicate that no signal is being transmitted from an input connector 120. In one embodiment, the signal received at input connector 120C is consumed by the stackable unit 101.

For example, a stackable unit 101 may comprise a microchip. Each of the input connectors 120A, B, C comprises one or more pins on one part of the chip (e.g. on the bottom). Each of the output connectors 110A, B, C may be one or more pins located on a particular part of the chip (e.g. on the top). In such a case, the signal from input connector 120A is transmitted to output connector 110B. The signal from input connector 120B is transmitted to output connector 110C. No signal is provided to output connector 110A. The signal over input connector 120C may be consumed by the stackable chip 101. For example, where multiple chips need to use a system clock, stackable chips as described herein may provide a short distance, direct communication of a clock signal to numerous stacked chips.

Figure 4:
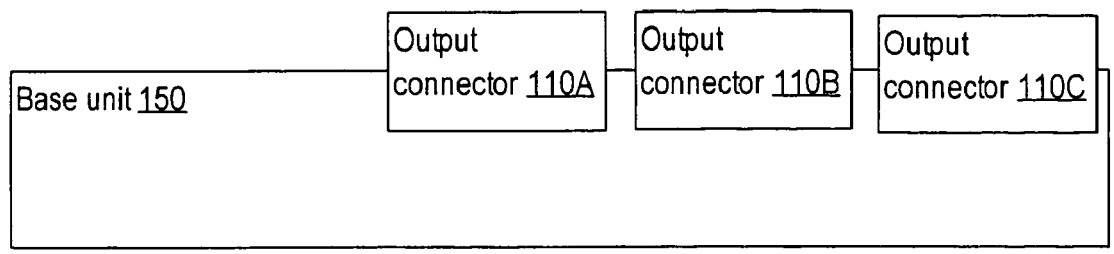
FIG. 4 depicts an example base unit.

FIG. 4 depicts an example base unit 150. In various embodiments, the base unit 150 comprises one or more output connectors 110A, B, C. In the embodiment depicted in FIG. 4, the base unit 150 comprises output connectors 110A, B, C. The output connectors 110A, B, C may each be one or more separate physical connectors or may be aggregated into one or more physical connectors. Embodiments of output connectors 110A, B, C are described above.

In various embodiments, the base unit 150 provides one or more signals over each output connector 110A, B, C. In various embodiments, the base unit 150 provides the same or different types of signals over each output connector 110A, B, C.

FIG. 5 depicts a single base unit 150 communicatively coupled to three stackable units 110A, B, C.

Various embodiments of base units 150; stackable units 101A, B, C; input connectors 120A, B, C, D, E, F, G, H, I, J, K, L; and output connectors 110A, B, C, D, E, F, G, H, I, J, K, L. Various embodiments of links 502A–O are described above with respect to link 102. In addition, in various embodiments, communicatively coupling between an output connector 110A, B, C, D, E, F, G, H, I, J, K, L on a first stackable unit 101 and the input connector 120A, B, C, D, E, F, G, H, I, J, K, L on a second stackable unit can be performed by a links 502G–502O by physically connecting the input connector 120A, B, C, D, E, F, G, H, I, J, K, L and the output connector 110A, B, C, D, E, F, G, H, I, J, K, L by enabling the transmission of optical, infrared, or radio signals between the input connector 120A, B, C, D, E, F, G, H, I, J, K, L and the output connector 110A, B, C, D, E, F, G, H, I, J, K, L, or by any other appropriate means. For example, if the input connector 120A and output connector 110A are USB connectors, then the two may be communicatively coupled by plugging in the male USB connector (e.g. the input connector 120A) to the female USB connector (e.g. the output connector 110A).

In one embodiment, base unit 150 comprises output connectors 110A, B, C. In one embodiment, stackable unit 101A comprises output connectors 110 D, E, F and input connectors 120 D, E, F; input connector 120 D is communicatively coupled to output connector 110 E by link 502E; and input connector 120 E is communicatively coupled to output connector 110 F by link 502F. In one embodiment, stackable unit 101 B comprises output connectors 110 G, H, I and input connectors 120 G, H, I; input connector 120 G is communicatively coupled to output connector 110 H by link 502C; and input connector 120 H is communicatively coupled to output connector 110 I by link 502D. In one embodiment, stackable unit 101 C comprises output connectors 110 J, K, L and input connectors 120 J, K, L; input connector 120 J is communicatively coupled to output connector 110 K by link 502A; and input connector 120 K is communicatively coupled to output connector 110 L by link 502B.

In one embodiment, and as depicted in FIG. 5, signals passed from base unit 150 are transmitted through each of the stackable units 101A, B, C. For example, a signal is communicated among connectors 110A, 120D, 110E, 120H, 110I, and 120L via links 502G, E, K, D, O. In various embodiments, the signals transmitted through output connectors 110A, 110B, 110C may be any appropriate signal, including power, network, audio, or a clocking signal.

In one embodiment, output connector 110A is communicatively coupled to input connector 120D by link 502G, which is communicatively coupled to output connector 110E by link 502E, which is communicatively coupled to input connector 120H by link 502K, which is communicatively coupled to output connector 110I by link 502D, which is communicatively coupled to input connector 120L by link 502O. In a related embodiment, a signal is transmitted from base unit 150 to stackable unit 110C via output connector 110A, input connector 120D, output connector 110 E, input connector 120H, output connector 110I, and input connector 120L via links 502 G, E, K, D, O.

In one embodiment, output connector 110B is communicatively coupled to input connector 120E by link 502H, which is communicatively coupled to output connector 110F by link 502F, which is communicatively coupled to input connector 120I by link 502L. In a related embodiment, a signal is transmitted from base unit 150 to stackable unit 101B via output connector 110B, input connector 120E, output connector 110F, and input connector 120I via links 502 H, F, L.

In one embodiment, output connector 110C is communicatively coupled to input connector 120F by link 502I. In a related embodiment, a signal is transmitted from base unit 150 to stackable unit 101A via output connector 110C and input connector 120F by link 502I.

In one embodiment, output connector 110D is communicatively coupled to input connector 120G by link 502J, which is communicatively coupled to output connector 110H by link 502C, which is communicatively coupled to input connector 120K by link 502N, which is communicatively coupled to output connector 110L by link 502B. In various embodiments, a terminating signal, such as no signal or a particular signal or signals, is provided on output connector 110D of stackable unit 101A to signify that it is not transmitting a signal from an input connector. In a related embodiment, no signal or a particular signal or signals is transmitted over each of the communicatively coupled connectors: output connector 110D, input connector 120G, output connector 110H, input connector 120K, output connector 110L via links 502J, C, N, B.

In one embodiment, output connector 110G is communicatively coupled to input connector 120J by link 502M, which is communicatively coupled to output connector 110K by link 502A. In various embodiments, no signal or a particular signal or signals is provided on output connector 110G of stackable unit 101B to signify that it is not transmitting a signal from an input connector. In a related embodiment, a terminating signal, such as no signal or a particular signal or signals, is transmitted over each of the communicatively coupled connectors: output connector 110G, input connector 120J, and output connector 110K via links 502M and A.

In various embodiments, a terminating signal such as no signal or a particular signal or signals, is provided on output connector 110J of stackable unit 101C to signify that output connector 110J is not transmitting a signal from an input connector.

As depicted in the embodiment of FIG. 5, the number of stackable units communicatively coupled to a base unit can be limited by the spatial relation of the connectors by the manner in which input connectors 120 and output connectors 110 are communicatively coupled within a single stackable unit 101. In the particular example embodiment, in each stackable unit 101A, B, C, the number of signals, originally from the base unit 150, transmitted to the next higher stackable unit 101 is reduced by one. Because the number of signals transmitted from the base unit to the subsequent stackable unit 101 ultimately is reduced to zero, a natural limitation of the number of units stacked is achieved. Whereas one may connect more stackable units 101, no signal from the base unit 150 is received at higher level units. There are a number of situations where such a limitation is useful, including controlling the number of stackable units for addressing reasons, power consumption reasons, aesthetic reasons, or marketing reasons.

Various embodiments of the techniques described herein enable signals to be passed among multiple stacked devices without external cabling. Various embodiments of the techniques described herein also enable a stacked device to be communicatively coupled to a base unit without any intervening logic or wires external to the base unit or stackable units, even if the base unit and the stackable unit are not physically connected—this may be termed "discrete home runs". A discrete home run enables, among other things, determination of which stackable unit is connected to which signal. In an embodiment where the signal is two way, a discrete home run may be used to determine whether a stackable unit is connected or to determine the state of a connected stackable unit.

2.2 Example Embodiments

A few example embodiments are described above. Other examples include stackable hard drives, stackable switches and hubs with a switch, hub, or router as a base unit, stackable duplication units, and many others.

Figure 6:
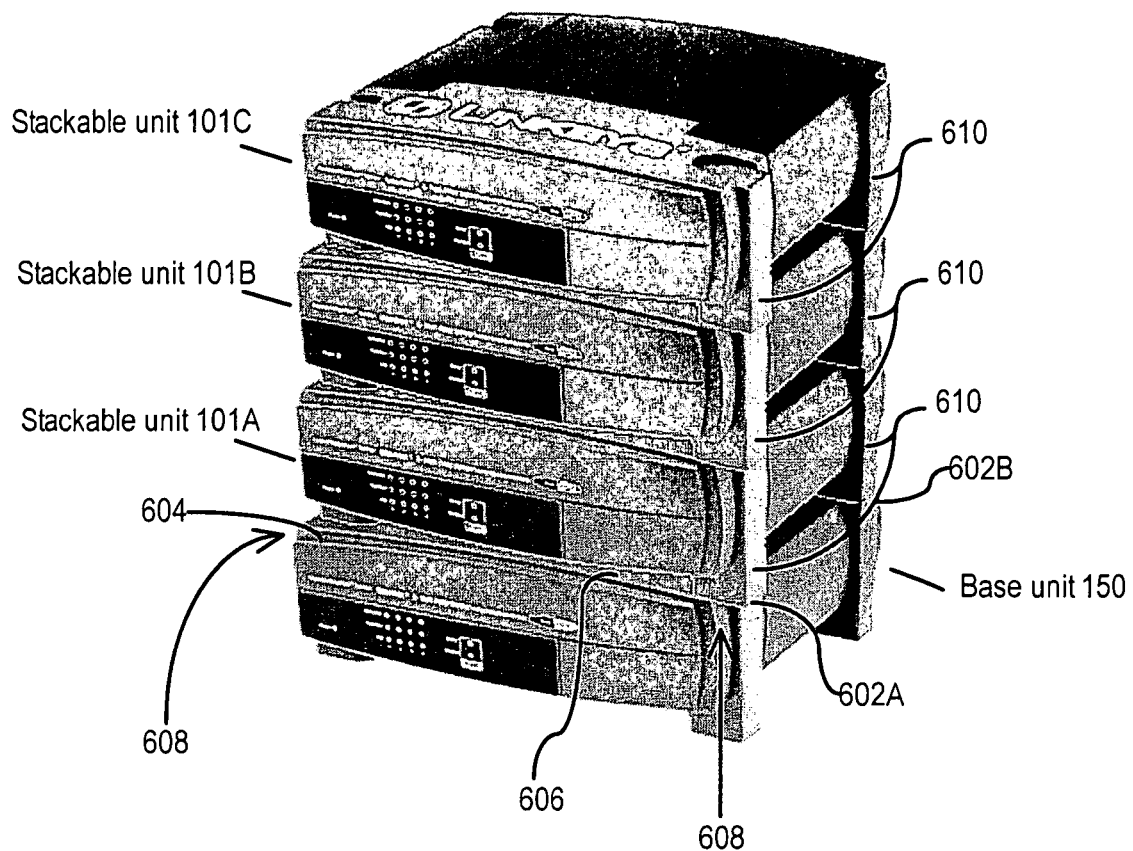
FIG. 6 depicts an embodiment of the techniques described herein for stackable network attached storage.

FIG. 6 depicts an embodiment of the techniques described herein for stackable network attached storage using a standard Linksys™ case. The Linksys case of FIG. 6 is included for illustrative purposes only. The techniques described herein are in no way limited to the case of FIG. 6 or any Linksys case. Any appropriate case or casing mechanism may be used. Illustrations of other example Linksys cases may be found at the Linksys website www.linksys.com. In the embodiment, the base unit 150 includes network connections and logic and may also include one or more disk drives. The stackable units 101A, B, C snap onto the top of the base unit and require no external cabling to receive signals from base unit 150 and communicate signals in the stack. The stackable units 101A, B, C may each house one or more disk drives.

In the embodiments of FIG. 6, the connectors and links of the stackable units 101 and base unit 150 are as depicted in FIG. 5. In various embodiments, each connector is a USB connector, is part of an aggregate input or output connector or is any other appropriate connector or set of connectors. The coupling of input connectors and output connectors may be accomplished in any manner described herein.

In one particular embodiment, base unit 150 provides standard USB connectors in the top of each of the foot wells 602A, 602B at the extremes of the top side 606 of base unit 150—e.g., one USB connector on each corner 608 on the top 606 of the unit 150. The stackable units 101A, B, C each comprise an appropriate USB mating connector at the bottom of each foot 610. Therefore, two units (either a base unit 150 and a stackable unit 101, or two stackable units 101) can be snapped together at the feet to form connections as shown in FIG. 5. A stackable unit 101A, B, C connects one of these USB connectors in its feet 610 to its internal circuitry.

The connection of the separate connectors may also be accomplished by aggregating the multiple input connectors and aggregating the multiple output connectors. In such an embodiment, the aggregate input connector of one stackable unit 101 may connect to the aggregate output connector of a different stackable unit 101 or a base unit 150.

Such embodiments as described with respect to FIG. 6 enable controlled expansion of network-attached storage available via the base unit 150. Such embodiments ensure discrete home runs from the base unit 150 to each of the connected stackable units 101A, B, C, control the number of stackable network attached storage units that may be used in the system, and eliminate the need for external wiring to connect the base unit and stackable units. One may build such a stackable network attached storage system in order to, among other reasons, limit the amount of storage available from a single system. This result may be useful as the logic in base units may be limited in the amount of memory it can address in the aggregated storage units.

Another example embodiment of FIG. 5 and FIG. 6 is a stackable hub with a router as a base unit. In such an embodiment, the connectors and links depicted in FIG. 5 may be used. The base unit 150 may have an aggregate output connector, containing two or more output connectors 110A, B, C, disposed on the top 606 of the base unit 150. The stackable hubs 101A, B, C may each use a single network signal from an input connector 120 of the two or more network signals passed from the base unit 150 or from the stackable hub 101 below it. Each stackable hub may pass some of the input network signals, other than the one or more it is using, to the stackable hub above it (if there is one) because the appropriate input connector 120 is communicatively coupled to the appropriate output connector 110 (see FIG. 5).

Such embodiments may ensure a discrete home run from the base router unit 150 to each of the connected stackable hubs 101A, B, C. These embodiments control the number of stackable hubs that may be used in the system, and may eliminate the need for external wiring to connect the base unit 150 and stackable units 101A, B, C. One may build such a stackable router/hub system in order to limit the number of network connections available in a particular system—which may be useful for controlling power distribution, abiding by driver logic, and adhering to network addressing limitations.

Another example embodiment is a stackable media duplication system with a player as a base unit 150 and one or more recorders as stackable units 101A, B, C for media such as compact discs (CDs), tapes, etc. The configuration may be similar to the one depicted in FIG. 5. In an example embodiment for audio CD duplication, base unit 150 is a player and has multiple output connectors 110A, B, C, disposed on the top of the base unit 150. The stackable units 101A, B, C are CD recorders and each consume the signal from a single audio input connector 120 of two or more audio input connectors 120 passed from the base unit 150 or the stackable recorder 101 below it. Each stackable recorder may pass the input audio signals, other than the one it uses, to the stackable recorder above it (if there is one) by ensuring that the appropriate input connector 120 is communicatively coupled to the appropriate output connector 110 (see FIG. 5).

Such an embodiment may ensure a discrete home run from the base player unit 150 to each of the connected stackable recorders 101A, B, C, may control the number of stackable recorders that may be used in the system, and may eliminate the need for external wiring to connect the base unit and stackable units. One may build such a system to limit the number of recorders in order to, e.g., limit the power needed to generate the output audio signals.

Figure 8:
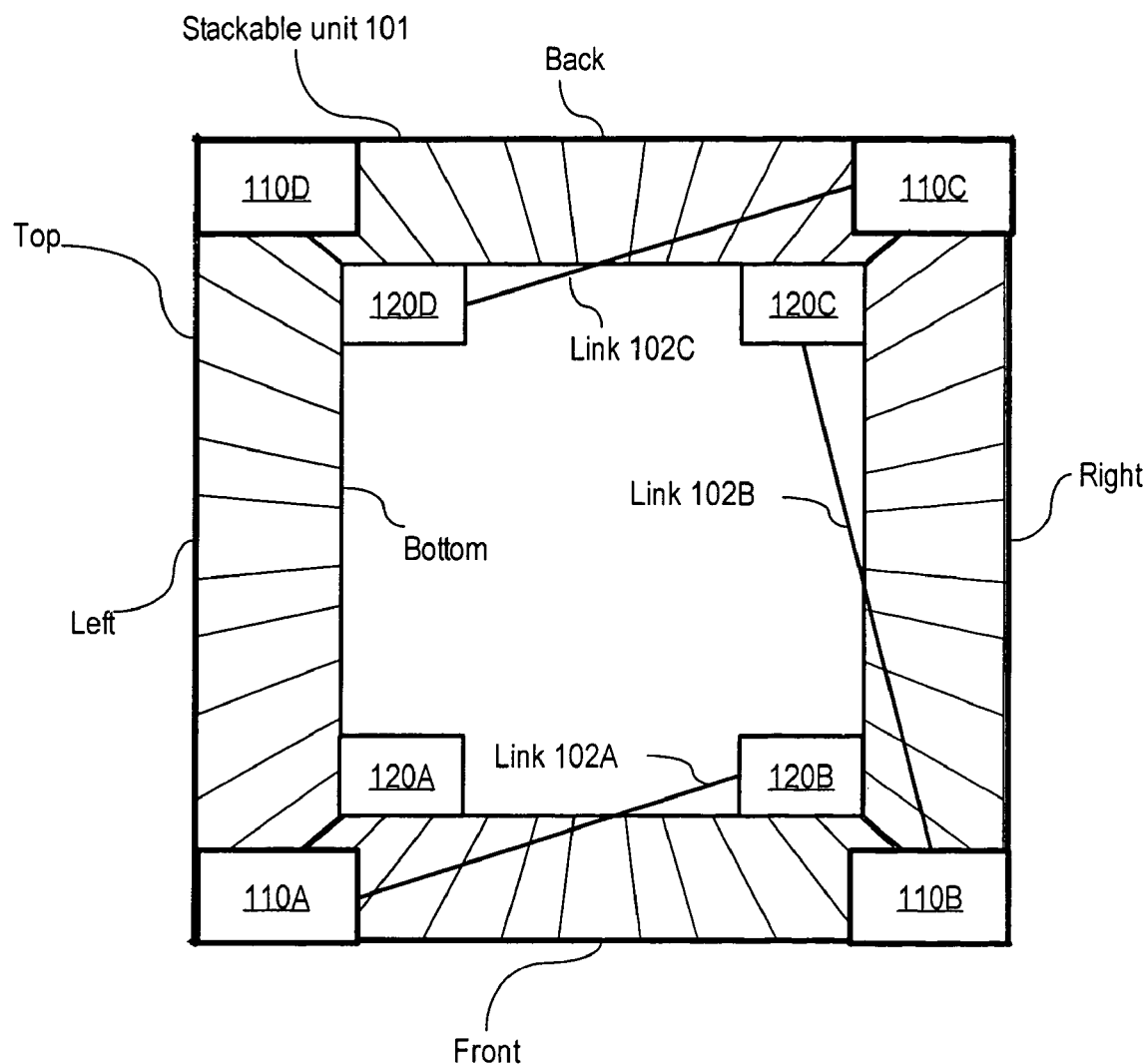
FIG. 8 depicts a foreshortened top-rendered view of an example embodiment of a stackable unit

FIG. 8 depicts a foreshortened top-rendered view of an example embodiment of a stackable unit 101. The left front output connector 110A on top may be communicatively coupled to the right front input 120B connector on the bottom by link 102A; the right front output connector 110B on the top may be communicatively coupled to the right back input connector 120C on the bottom by link 102B; the right back output connector 110C on the top may be communicatively coupled to the left back input connector 120D on the bottom by link 102C; and the left back output connector 110D on the top may be a dummy connector which passed no signal or a particular terminating signal. In one embodiment, the signal arriving over input connector 120D is consumed by the unit 101.

Example embodiments such as the one depicted in FIG. 8 provide a physical layout for linking input connectors and output connectors. Such example embodiments may be used to limit the number of stackable units that may be stacked upon a base unit. The techniques described herein are in no way limited to such embodiments, and many other layouts and linking schemes are possible.

3.0 Functional Overview

Figure 7:
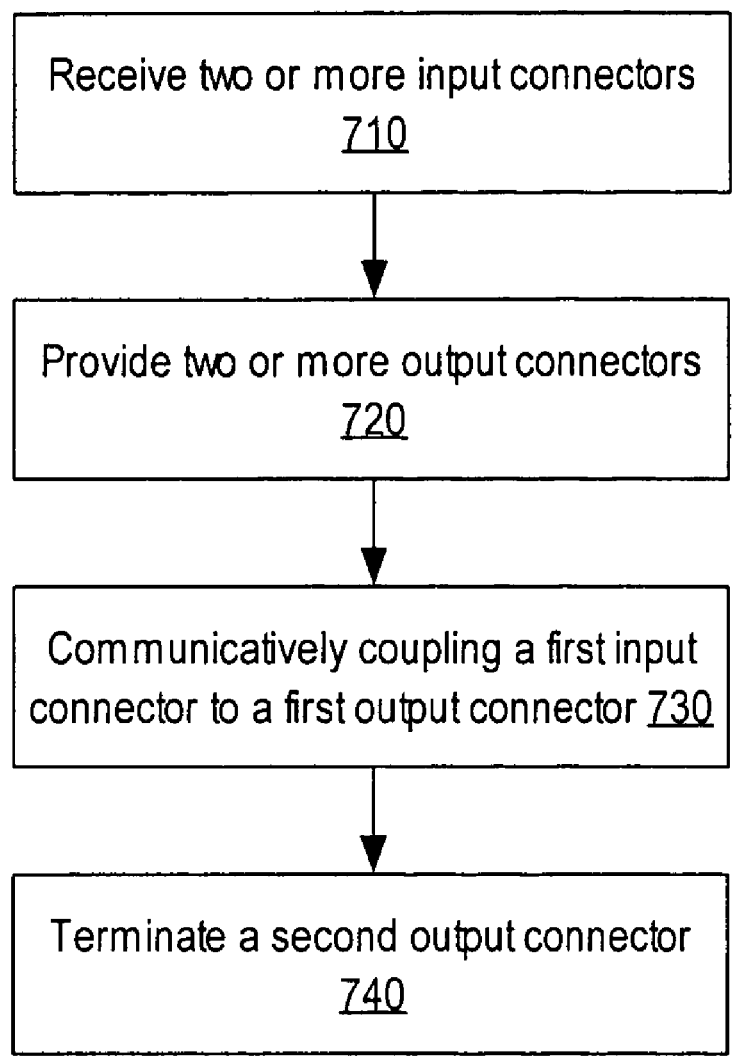
FIG. 7 depicts a flow diagram for a method of distributing one or more electronic signals.

FIG. 7 depicts a flow diagram for a method of distributing one or more electronic signals.

In step 710, two or more input connectors are provided. In various embodiments, these connectors can receive signals comprising power, network, audio, video, or any other appropriate signal. In various embodiments, the connectors carry single signals or carry multiple signals. In various embodiments, the two or more input connectors are part of a single aggregate input connector or are part of separate connectors. For example, in the context of FIG. 1, two network signals are received at input connectors 120A, B.

In step 720, two or more output connectors are provided. In various embodiments, the output connectors carry signals comprising power, network, audio, video, or any other appropriate signal. In various embodiment, no signal or a terminating signal is provided over one or more output connectors of the two or more output connectors. For example, in the context of FIG. 1, network and audio signals are provided at one of the output connectors 110B, and no signal is provided at the output connector 110A.

In step 730, a first input connector of the two or more input connectors is communicatively coupled to a first output connector of the two or more output connectors. In various embodiments, the first input connector and the first output connector are communicatively coupled via conductive metal, optical, infrared, or radio transmission, or any other appropriate means. For example, in the context of FIG. 1, the input connector 120A is communicatively coupled to the output connector 110B using conductive metal.

In step 740, a second output connector of the two or more output connectors, distinct from the first output connector, is terminated. In various embodiments, terminating this connector comprises providing no signal over the connector or providing a particular signal or signals that indicate that the output signal or signals are not "live", e.g. that the signals are not signals from input connectors.

In various embodiments of the techniques of FIG. 7, a signal on the second input connector of the two or more input connectors, distinct from the first input connector, is consumed. For example, in the context of a stackable network hub, a network signal incoming on the second input connector is used by a stackable network hub to provide network connection to network devices connected to the network hub.

Such embodiments as described by FIG. 7 if applied to a stackable unit may ensure a discrete home run from a base unit to each of the connected stackable unit; may control the number of stackable units that may be used in the system, and may eliminate the need for external wiring to connect the base unit and stackable units. One may utilize these techniques for any of the reasons described above.

4.0 Extensions And Alternatives

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. An apparatus for distributing signals in a stackable unit, comprising:
   a first input connector of two or more input connectors;
   a second input connector of the two or more input connectors, wherein the first input connector is laterally spaced apart from the second input connector, and the first input connector has a particular spatial relationship to the second input connector;

a first output connector of two or more output connectors;
a second output connector of the two or more output connectors, wherein the first output connector is laterally spaced apart from the second output connector, and the first output connector has the same particular spatial relationship to the second output connector;
wherein the two or more input connectors are disposed on a bottom plane of the stackable unit and the two or more output connectors are disposed on a top plane of the stackable unit, wherein the bottom plane and the top plane are vertically spaced apart;
means for communicatively coupling the first input connector and the second output connector;
wherein the first output connector is aligned substantially vertically with the first input connector and the second output connector is aligned substantially vertically with the second input connector, but the second output connector is not aligned substantially vertically with the first input connector: and
means for terminating the first output connector.

2. The apparatus of claim 1, wherein the stackable unit is a stackable hub, wherein the two or more output connectors and the two or more input connectors are USB connectors, and wherein each of the two or more input connectors is disposed in a foot of the stackable hub and each of the two or more output connectors is disposed in a top portion of the stackable hub in a position substantially above a particular input connector of the two or more input connectors.

3. The apparatus of claim 1, wherein the stackable unit is a stackable expansion module for network attached storage; the two or more output connectors and the two or more input connectors are USB connectors; and each of the two or more input connectors is disposed in a foot of the stackable expansion module and each of the two or more output connectors is disposed in a top portion of the stackable expansion module in a position substantially above a particular input connector of the two or more input connectors.

4. The apparatus of claim 1, wherein the two or more output connectors comprise three or more output connectors; and wherein the apparatus further comprises a means for terminating a third output connector of the three or more output connectors, wherein the third output connector is spaced apart from both the first output connector and the second output connector.

5. The apparatus of claim 1, wherein an aggregate input connector comprises the two or more input connectors; and an aggregate output connector comprises the two or more output connectors.

6. The apparatus of claim 1, wherein the two or more input connectors are provided as two or more separate connectors and the two or more output connectors are provided as two or more separate connectors.

7. The apparatus of claim 1, wherein at least one of the two or more input connectors is located at one extreme of the apparatus and at least one of the two or more output connectors is located at a corresponding extreme on an opposite portion of the apparatus.

8. The apparatus of claim 1, wherein the stackable unit is a stackable audio component, each of the two or more input connectors is capable of receiving an audio signal.

9. The apparatus of claim 1, wherein the stackable unit is a stackable video component, each of the two or more input connectors is capable of receiving a video signal.

10. The apparatus of claim 1, wherein each connector of the two or more input connectors and each connector of the two or more output connectors is capable of transmitting power and the second output connector is terminated by providing no power over the second output connector.

11. The apparatus of claim 1, wherein the stackable unit is a stackable recording device and each connector of the two or more input connectors and each connector of the two or more output connectors is capable of transmitting a recordable signal and the means for terminating the second output connector comprises a means for transmitting a particular signal that indicates that the recordable signal is not being transmitted over the second output connector.

12. The apparatus of claim 1, wherein the second input connector of the two or more input connectors carries a particular signal, wherein the particular signal is a terminating signal and the apparatus further comprises a means for detecting the terminating signal.

13. The apparatus of claim 1, wherein each connector of the two or more input connectors and each connector of the two or more output connectors is capable of transmitting two or more signals.

14. The apparatus of claim 1, wherein the stackable unit is a microchip and wherein each connector of the two or more input connectors and each connector of the two or more output connectors comprises one or more pins on the microchip.

15. The apparatus of claim 14, wherein each connector of the two or more input connectors and each connector of the two or more output connectors is capable of transmitting a clock signal; and the means for terminating the second output connector comprises sending a signal other than the clock signal over the second output connector.

16. The apparatus of claim 1, further comprising:
means for providing a first signal through the stackable unit through the second output connector to a plurality of stackable units that are disposed above the stackable unit, wherein the two or more output connectors comprise three or more output connectors;
means for providing a second signal through the stackable unit through a third output connector of the two or more output connectors to the plurality of stackable units; and
means for determining which signal is provided to a particular unit of the plurality of stackable units by determining through which output connector a particular signal is being provided.

17. The apparatus of claim 1, wherein a first signal carried by the first input connector is transmitted through the second output connector for consumption by a different stackable unit, and wherein a second signal carried by the second input connector is consumed by the stackable unit.

18. The apparatus of claim 1, wherein the number of the two or more input connectors determines the maximum number of stackable units to which the stackable unit is capable of distributing signals.

19. A method of distributing signals in a stackable unit, the method comprising the steps of:
providing a first input connector of two or more input connectors;
providing a second input connector of the two or more input connectors, wherein the first input connector is laterally spaced apart from the second input connector, and the first input connector has a particular spatial relationship to the second input connector;
providing a first output connector of two or more output connectors;
providing a second output connector of the two or more output connectors, wherein the first output connector is laterally spaced apart from the second output connector, and the first output connector has the same particular spatial relationship to the second output connector;

wherein the two or more input connectors are disposed on a bottom plane of the stackable unit and the two or more output connectors are disposed on a top plane of the stackable unit, wherein the bottom plane and the top plane are vertically spaced apart;

communicatively coupling the first input connector and the second output connector;

wherein the first output connector is aligned substantially vertically with the first input connector and the second output connector is aligned substantially vertically with the second input connector, but the second output connector is not aligned substantially vertically with the first input connector; and terminating the first output connector.

20. The method of claim 19, further comprising the steps of:

providing a first signal through the stackable unit through the second output connector to a plurality of stackable units that are disposed above the stackable unit, wherein the two or more output connectors comprise three or more output connectors;

providing a second signal through the stackable unit through a third output connector of the two or more output connectors to the plurality of stackable units; and determining which signal is provided to a particular unit of the plurality of stackable units by determining through which output connector a particular signal is being provided.

21. An apparatus for distributing signals in a stackable unit, comprising:

a first input connector of four or more input connectors, wherein the first input connector is disposed in a first foot of the stackable unit;

a second input connector of the four or more input connectors, wherein the second input connector is disposed in a second foot of the stackable unit;

a third input connector of the four or more input connectors, wherein the third input connector is disposed in a third foot of the stackable unit;

a fourth input connector of the four or more input connectors, wherein the fourth input connector is disposed in a fourth foot of the stackable unit;

wherein the first input connector, the second input connector, the third input connector, and the fourth input connector are laterally spaced apart from each other;

a first output connector of four or more output connectors, wherein the first output connector is disposed in a top portion of the stackable unit and is aligned substantially vertically with the first input connector;

a second output connector of the four or more output connectors, wherein the second output connector is disposed in the top portion of the stackable unit and is aligned substantially vertically with the second input connector;

a third output connector of the four or more output connectors, wherein the third output connector is disposed in the top portion of the stackable unit and is aligned substantially vertically with the third input connector;

a fourth output connector of the four or more output connectors, wherein the fourth output connector is disposed in the top portion of the stackable unit and is aligned substantially vertically with the fourth input connector;

a first communication link that couples the first output connector and the second input connector, wherein the first output connector is not aligned substantially vertically with the second input connector;

a second communication link that couples the second output connector and the third input connector, wherein the second output connector is not aligned substantially vertically with the third input connector;

a third communication link that couples the third output connector and the fourth input connector, wherein the third output connector is not aligned substantially vertically with the fourth input connector;

wherein a signal carried by the first input connector is consumed by the stackable unit; and wherein the fourth output connector is electrically terminated.

* * * * *